United States Patent
Nishi

[11] Patent Number: 5,892,572
[45] Date of Patent: Apr. 6, 1999

[54] PROJECTION EXPOSURE APPARATUS AND METHOD

[75] Inventor: Kenji Nishi, Yokohama, Japan

[73] Assignee: Nikon Corporation, Tokyo, Japan

[21] Appl. No.: 2,389

[22] Filed: Jan. 2, 1998

Related U.S. Application Data

[63] Continuation of Ser. No. 329,202, Oct. 26, 1994, abandoned.

[30] Foreign Application Priority Data

Oct. 28, 1993 [JP] Japan .................................. 5-270380
Oct. 21, 1994 [JP] Japan .................................. 6-256361

[51] Int. Cl.$^6$ .......................... G03B 27/42; G03B 27/52; G03B 27/54
[52] U.S. Cl. .................................. 355/67; 355/53; 355/55
[58] Field of Search .................................. 355/53, 55, 67

[56] References Cited

U.S. PATENT DOCUMENTS 4,699,505 10/1987 Komoriya et al. .................. 355/30
4,989,031 1/1991 Kamiya .................................. 355/30

Primary Examiner—Richard Moses
Assistant Examiner—Shival Virmani
Attorney, Agent, or Firm—Shapiro and Shapiro

[57] ABSTRACT

A projection exposure apparatus has an exposure processing section for projecting and exposing an image of a pattern of a reticle on a photosensitive substrate, an environmental chamber for covering the exposure processing section and a fan unit for supplying a temperature-controlled gas to the environmental chamber. Exposure to the photosensitive substrate is carried out in a temperature-controlled atmosphere. The pressure of the gas in the environmental chamber is monitored by a pressure sensor. When the pressure is changed, the mixture ratio of the gas supplied to the environmental chamber is changed to keep the refractive index of the gas in the chamber constant thereby to prevent imaging characteristics of the projected image from deteriorating.

85 Claims, 3 Drawing Sheets

PROJECTION EXPOSURE APPARATUS AND METHOD

CROSS REFERENCE TO RELATED APPLICATION

This application is a continuation of U.S. application Ser. No. 08/329,202 filed Oct. 26, 1994, now abandoned.

BACKGROUND OF THE INVENTION

1. Field of the Invention

The present invention relates to a projection exposure apparatus, e.g., provided in an environmental chamber connected to an air-conditioning mechanism for manufacturing semiconductor devices, liquid crystal display devices, etc. to a method of controlling optical performance in a projection exposure apparatus, and to a method for making a lithographic system.

2. Related Background Art

In manufacturing semiconductor devices, liquid crystal display devices, etc. in photolithography processes, projection exposure apparatuses are used in which the image of a pattern of a photomask or a reticle (hereinafter referred to as the reticle) is exposed on a wafer (or a glass plate) with photoresist applied thereto.

FIG. 3 shows a conventional projection exposure apparatus. Exposure light IL from an illumination optical system 1 illuminates a pattern on a reticle 2 supported by a reticle stage 3 with a uniform illuminance distribution. A projection optical system 4 is disposed under the reticle stage 3. A correction optical member 7 for correcting the telecentric characteristic of the projection optical system 4 is mounted on the reticle side of the projection optical system 4 via supporting frames 5A, 5B and driving sections 6A, 6B. The telecentric characteristic of the projection optical system PL can be corrected by correcting the position of the correction optical member 7 in the optical axis direction or the inclination thereof via the driving sections 6A, 6B.

Under the exposure light IL, the pattern of the reticle 2 is projected and exposed via the projection optical system 4 on each shot area on a wafer 8 supported by a wafer stage 9. At this time, the projected image on the wafer 8 includes various aberrations in accordance with the change in atmospheric pressure in the projection optical system PL. That is, the projection optical system 4 is designed under a condition that the atmospheric pressure is a predetermined value. Therefore, when the atmospheric pressure in the projection optical system 4 is changed from the predetermined value, the refractive index of the gas in each space between lenses constituting the projection optical system 4 is changed, resulting in deviations from various design conditions, i.e., changes of imaging characteristics (focal point position, magnification, field curvature, distortion, etc.).

For avoiding this problem, conventionally, the atmospheric pressure in the projection optical system 4 is measured by an atmospheric pressure sensor 10 and the measured value is constantly monitored by a control device 11. Then, the control device 11 adjusts the atmospheric pressure in a space 16 between the n-th lens 14 (n: a predetermined integer) in the projection optical system 4 and the (n+1)-th lens 15 therein via a pressure control unit 12, or changes the position or inclination of the correction optical member 7 by driving the driving sections 6A, 6B of the projection optical system 4 via a drive control device 17 thereby to correct the changes of various aberrations of the projected image due to the change in atmospheric pressure. A method of changing imaging characteristics by controlling the pressure in a specific space between lenses in a projection optical system is disclosed in U.S. Pat. No. 4,666,273. Also, a method of changing imaging characteristics by driving a few lens elements in a projection optical system is disclosed in U.S. Pat. No. 5,117,255.

In the above prior art, the problem of the change in refracting index of the air due to the change in atmospheric pressure is solved by changing the pressure in the specific space between specified lens elements in the projection optical system 4 to change the refractive index of a portion of the air in the projection optical system 4, or changing the distance between the reticle 2 and the wafer 8 or the distance between the lens elements in the projection optical system 4. There are many factors which cause distortion of the projected image due to the projection optical system 4, and allowable ranges of aberrations are limited vary narrowly. For example, as a factor of the distortion of the projected image due to the change in atmospheric pressure, there are aberrations caused by the defocus condition in which the focus position is changed between the reticle and the wafer. As the other aberrations, there are field curvature, comatic aberration, astigmatism, magnification, distortion, etc. Therefore, it becomes difficult to correct all the aberrations of the projected image up to presently required levels only by changing the distance between the reticle 2 and the wafer 8 or changing a portion of lens conditions in the projection optical system 4 (the pressure between lenses, the distance between lenses).

Also, when a laser light source such as an excimer laser is utilized as the light source in the illumination optical system 1, if the wavelength of laser light having a narrow bandwidth is shifted, the same effect as when the atmospheric pressure is changed can be obtained. However, it is difficult to correct the aberrations of the projected image due to the change in atmospheric pressure by adopting this method using present technology. Also, as the wavelength of the laser light is changed, the absorbability of the photoresist on the wafer is also changed.

SUMMARY OF THE INVENTION

Therefore, it is an object of the present invention to provide a projection exposure apparatus and method in which imaging characteristics of a projected image will not be deteriorated even though atmospheric pressure is changed.

According to the present invention, in a projection exposure apparatus having an exposure processing section for forming an image of a pattern of a mask on a photosensitive substrate via a projection optical system, a chamber for covering the exposure processing section, and an air-conditioning mechanism for supplying a temperature-controlled gas to the chamber, the projection exposure apparatus performing exposure to the photosensitive substrate in a temperature-controlled atmosphere, there are a sensor for measuring the refractive index of the gas in the chamber; and refractive index control means for controlling the refractive index of the gas supplied to the chamber from the air-conditioning mechanism in accordance with the measurement result of the sensor.

According to another embodiment of the present invention, in a projection exposure apparatus having an exposure processing section constituted of a light source for emitting light, an illumination optical system for illuminating a mask with the light and a projection optical system for projecting and exposing an image of a pattern of the mask on a photosensitive substrate, an imaging characteristic adjusting section for adjusting imaging characteristics of the projection optical system, a chamber for covering said exposure processing section and an air-conditioning mechanism for supplying a temperature-controlled gas to the chamber, there are a sensor for measuring a change in refractive index of the gas in said chamber; refractive index control means for controlling the refractive index of the gas supplied from the air-conditioning mechanism to the chamber in accordance with the measurement result of said sensor; and a control section for controlling the imaging characteristics adjusting section, when using the gas whose refractive index is controlled, so as to correct a change of the imaging characteristics of said projection optical system due to factors other than the change in refractive index of the gas.

A projection exposure apparatus having an exposure processing section for forming an image of a pattern of a mask on a photosensitive substrate via a projection optical system and a chamber for covering said exposure processing section, comprising:

means for correcting a change of imaging characteristics of said projection optical system due to a change in refractive index of a gas in said chamber by changing the refractive index of the gas;

and means for correcting a change of imaging characteristics of said projection optical system due to factors other than the change in refractive index.

According to still another embodiment of the present invention, in a projection exposure apparatus having an exposure processing section for forming an image of a pattern of a mask on a photosensitive substrate via a projection optical system and a chamber for covering the exposure processing section, there are means for correcting a change of imaging characteristics of the projection optical system due to a change in refractive index of a gas in the chamber by changing the refractive index of the gas; and means for correcting a change of imaging characteristics of the projection optical system due to factors other than the change in refractive index.

According to the present invention, when the pressure of the gas in an environmental chamber (42) is changed due to the change in atmospheric pressure, the change in pressure is detected by pressure monitoring means (46) and the refractive index of the whole gas in the environmental chamber (42) containing the exposure processing section (44) including the projection optical system is changed by the refractive index control means (48, 26). Accordingly, the refractive index of the gas between the mask and the photosensitive substrate in the exposure processing section (44) is changed wholly to return to, e.g., the same value as the refractive index prior to the change in atmospheric pressure, whereby the same effect as when the atmospheric pressure is returned to the condition prior to its change can be obtained.

That is, even though the atmospheric pressure is changed, the changes in aberrations of the projected image of the projection optical system can be limited completely to zero by changing the refractive index of the gas in the environmental maintaining chamber (42) so as to cancel the change in atmospheric pressure. More specifically, the relational expression of the refractive index n (P, t) of the air obtained when the atmospheric pressure is P (mmHg) and the temperature is t (°C.) is expressed as follows. This is called Edlen's formula:

$$n(t,P) = \frac{n(15°\text{ C.},760\text{ mmHg}) - 1}{720.7753} \times \frac{P\{1 + (0.817 - 0.0133t)10^{-6}P\}}{1 + 0.003661t} \quad (1)$$

As is apparent from this formula, when the atmospheric pressure P and the temperature t are changed by $\Delta P$ and $\Delta t$ respectively from the standard condition (atmospheric pressure: 760 mmHg, temperature: 15° C.), the refractive index n (P, t) is changed by a predetermined amount. Then, by changing the refractive index of the gas so as to cancel this change of the refractive index, it is possible to keep the imaging characteristics of the projected image preferable regardless of the change in atmospheric pressure (the error caused by the humidity is omitted).

In this case, the refractive index of the gas in the environmental chamber (42) can be maintained to be a predetermined value more precisely by monitoring it actually with the refractive index monitoring means (49, 51).

For changing the refractive index of the gas, there is a method in which the gas is composed of a plurality of gases of different types and the mixture ratios thereof are changed. Besides this method, as known from the formula (1), the temperature or humidity of the gas may be changed to change the refractive index.

DESCRIPTION OF THE PREFERRED EMBODIMENTS

A projection exposure apparatus according to embodiment of the present invention will be described with respect to FIGS. 1 and 2. As the projection exposure apparatus of this embodiment, a conventional projection exposure apparatus shown in FIG. 3 is used.

Figure 1:
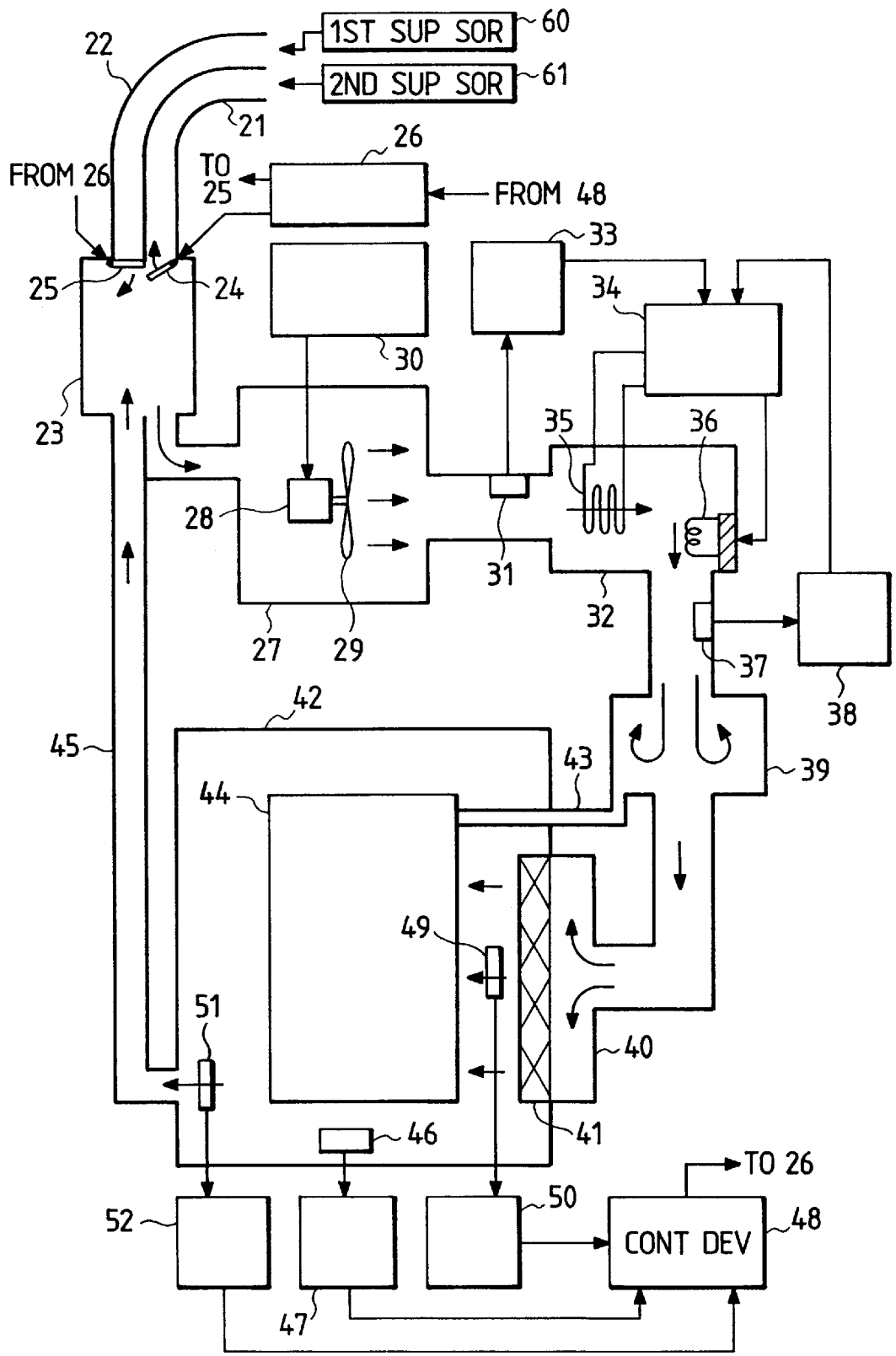
FIG. 1 is a block diagram showing the structure of a projection exposure apparatus according to an embodiment of the present invention.
Figure 3:
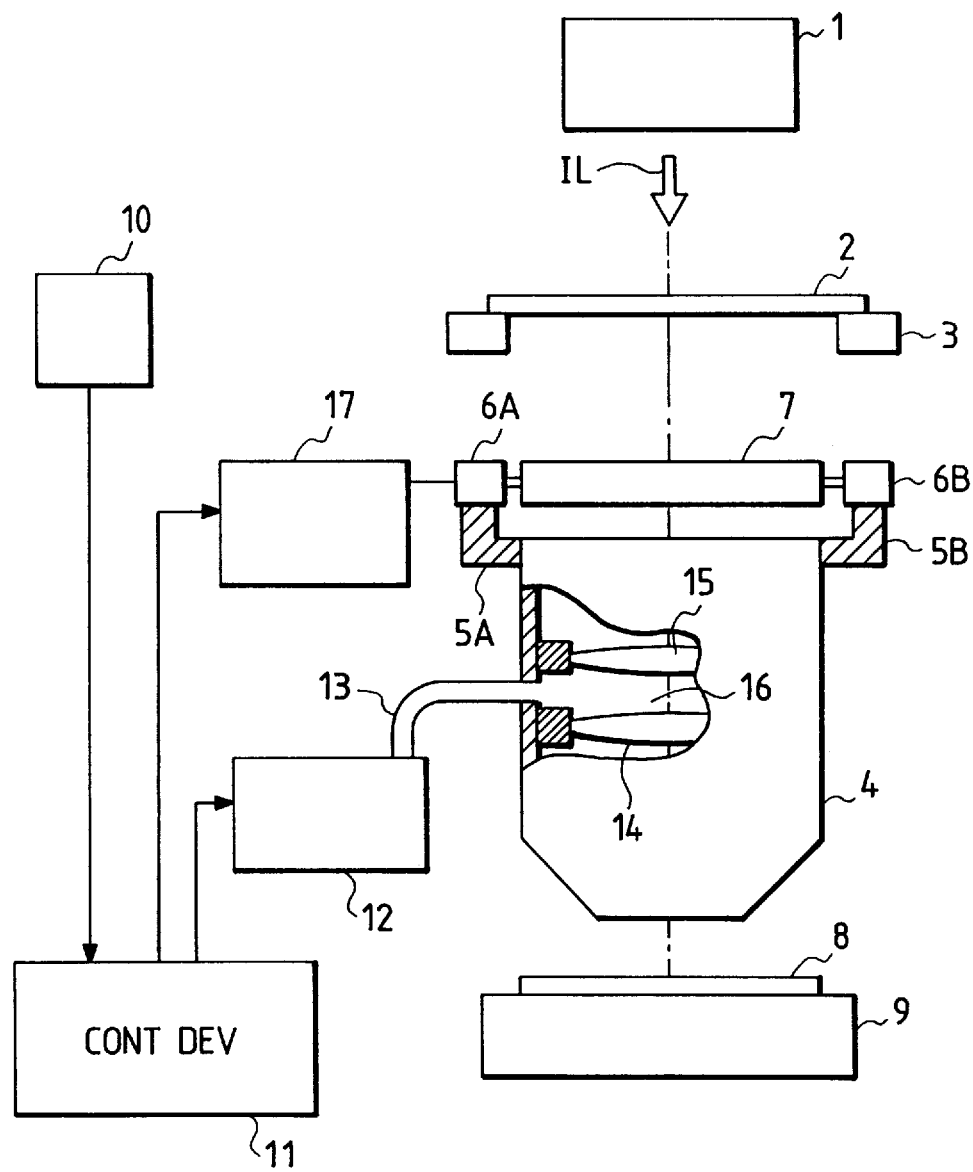
FIG. 3 is a partly broken block diagram showing the structure of a conventional projection exposure apparatus.

Referring to FIG. 1 showing an environmental chamber and an air-conditioning mechanism, a projection exposure apparatus 44 having the same structure as that in FIG. 3 is disposed in an environmental chamber 42, and air cleaned and controlled in temperature is constantly supplied from the air-conditioning mechanism to the environmental chamber 42 such that the temperature in the environmental chamber 42 is kept constant. The air in the environmental chamber 42 is circulated such that the pressure thereof becomes slightly higher than that of outside air. In FIG. 1, the air in the environmental chamber 42 is shown as being in a closed loop, but many openings are formed in side walls of the environmental chamber 42. However, as the pressure of the air in the environmental chamber 42 is slightly higher than that of the outside air, the inside air would escape through the openings but a quantity of air entering the environmental chamber 42 through the openings is negligible.

In the air-conditioning mechanism of this embodiment, air whose pressure is slightly higher than outside air (atmospheric air) around the environmental chamber 42 is supplied from a first supply source 60 to a gas ratio adjusting chamber 23 via a pipe 22. In parallel with this operation, a gas (e.g., nitrogen, helium, etc.) having a different refractive index from that of air is supplied from a second supply source 61 to the gas ratio adjusting chamber 23 via a pipe 21. An openable valve 24 is provided at a connecting portion between the pipe 21 and the gas ratio adjusting chamber 23 while an openable valve 25 is provided at a connecting portion between the pipe 22 and the gas ratio adjusting chamber 23. A gas ratio control unit 26 controls the opening and closing of the valves 24 and 25 to adjust the mixture ratio of gases in the gas ratio adjusting chamber 23, i.e., the environmental chamber 42 resultantly. The gases exhausted from the gas ratio adjusting chamber 23 go to a gas circulating chamber 27. A fan 28 for rotating blades 29 is provided in the gas circulating chamber 27. The operation of the fan 28 is controlled by an external adjusting unit 30 to keep the circulation velocity of the gases in the environmental chamber 42 constant.

The gases blown by the fan 28 reach a temperature adjusting chamber 32 via a connecting pipe in which a temperature sensor 31 is provided. A detection signal from the temperature sensor 31 is supplied to a measuring unit 33, which then obtains the temperature of the gases from the supplied signal and supplies this temperature information to a control section of an air compressor 34. The temperature adjusting chamber 32 is provided with a cooling portion 35 and a heating portion 36. The air compressor 34 controls temperatures of the cooling and heating portions and sets the temperature of the gases passing through the temperature adjusting chamber 32 to a desired temperature. The temperature controlled gases flow in a first diffusing chamber 39 via a connecting pipe in which another temperature sensor 37 is provided. A detection signal from the temperature sensor 37 is sent to a measuring unit 38, which then obtains the temperature of the gases from the sent signal and sends this temperature information to the air compressor 34. The air compressor 34 controls the temperature of the gases in the temperature adjusting chamber 32 according to the feedback control of the temperature detected by the temperature sensor 37.

Also, the gases are diffused in the first diffusing chamber 39 so as to prevent unevenness of a temperature distribution. The gases passed through the first diffusing chamber 39 flow in a second diffusing chamber 40 to let the gases blow toward the environmental chamber 42 uniformly. The gases from the second diffusing chamber 40 are blown into the environmental chamber 42 through a HEPA filter (High Efficiency Particulate Air Filter) for eliminating dust. Further, another pipe 43 is provided between the first diffusing chamber 39 and the projection exposure apparatus 44 in the environmental chamber 42. The gases passing through the pipe 43 are supplied to the pressure control unit 12 in FIG. 3. In this embodiment, the pressure control unit 12 in FIG. 3 is not necessarily required but is provided preliminarily.

The gases in the environmental chamber 42 are returned to the gas ratio adjusting chamber 23 via a heat insulating pipe 45 connected to the outlet of the environmental chamber 42. However, as described above, there are many openings in the side walls of the environmental chamber 42, so that all the gases supplied to the environmental chamber 42 are not returned to the gas ratio adjusting chamber 23.

Also, in this embodiment, a first refractive index measuring unit 49 is disposed in the environmental chamber 42 at a position receiving the gases blown from the HEPA filter 41 and a second refractive measuring unit 51 is disposed in the vicinity of the outlet of environmental chamber 42 connected to the pipe 45. Further, a pressure sensor 46 is provided in the vicinity of the projection exposure apparatus in the environmental chamber 42. The refractive index measuring units 49, 51 have the same structure and generate signals varied in accordance with the refractive indexes of the gases in the vicinity of those units according to the heterodyne interference method. The respective signals are supplied to respective signal processing units 50 and 52. The respective signal processing units 50 and 52 calculate refractive indexes based on the supplied signals and supply them to a control device 48. Similarly, the pressure sensor 46 supplies a signal varied in accordance with the pressure of the gases to a signal processing unit 47, which then supplies the atmospheric pressure information in the vicinity of the projection exposure apparatus 44 to the control device 48.

The control unit 48 controls the opening and closing of the valves 24, 25 via the gas ratio control unit 36 in accordance with the pressure of the supplied gases to adjust the mixture ratio of the gases thereby to keep the refractive index of the gases in the environmental chamber 42 constant. However, the control device 48 does not necessarily need to use the measurement result of the pressure sensor 46 and may control the opening and closing of the valves 24, 25 via the gas ratio control unit 26 such that the average value of the refractive indexes measured by the refractive index measuring units 49, 51 becomes constant. Also, in this case, as the refractive index of the gases is changed even when not only the atmospheric pressure but also the temperature or humidity is changed, the pressure sensor 46 is used to ascertain the actual present refractive index.

That is, the control unit 48 controls the gas ratio control unit 26 on the basis of the information from the pressure senior 46 and the refractive index measuring unit 49 (and 51). For example, where there is a difference between a temperature of a projection optical system (which is normally kept strictly constant) in a projection exposure apparatus and a temperature at a place on which the refractive index measuring unit 49 (and 51) is mounted, the refractive index in the projection exposure apparatus may be actually shifted from a desired value by a degree corresponding to the temperature difference even if the refractive index is kept constant through control of the gas ratio control unit 26 based upon the information from the refractive index measuring unit 49 (and 51). In order to solve the problem, the control unit 48 obtains a refractive index in the projection exposure apparatus on the basis of the information from the pressure sensor 46, and thereafter obtains as an offset value, a difference between the refractive index from the refractive index measuring unit 49 (and 51) and the refractive index obtained through the information from the pressure sensor 46. Finally, the control unit 48 controls the gas ratio control unit 26 by monitoring the refractive index from the refractive index measuring unit 49 (and 51), for adjusting a mixture ratio of gas, and obtaining an actual refractive index by correcting the offset.

Figure 2:
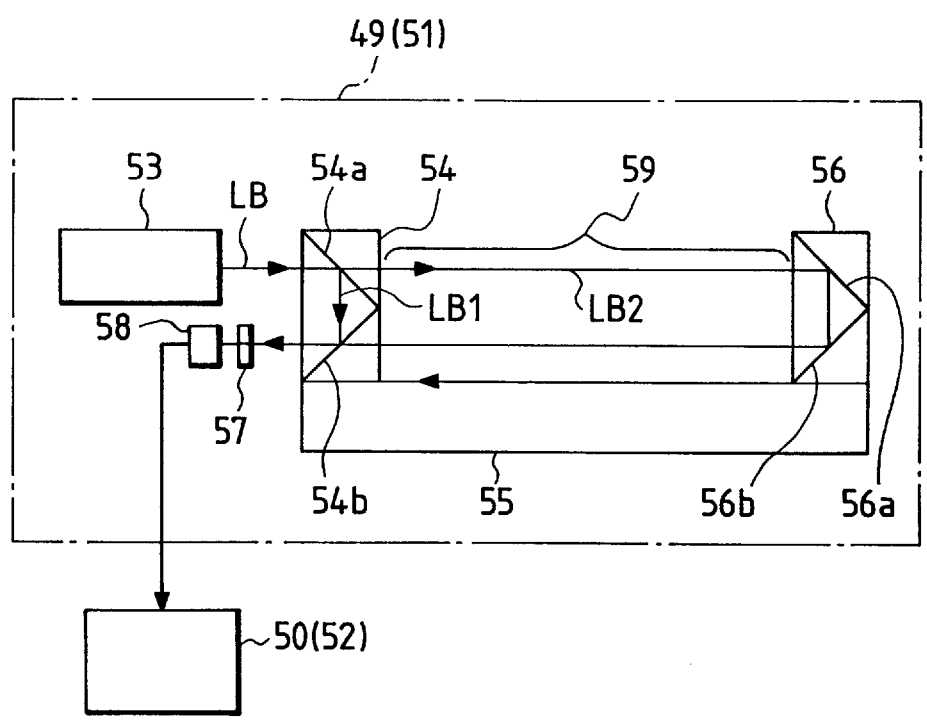
FIG. 2 is a side view showing the structure of the refractive index measuring unit 49 in FIG. 1.

Next, in FIG. 2 showing the structure of the refractive index measuring unit 49, an interference optical system is disposed on a fixed base 55 formed of zerodur having a small thermal expansion coefficient. A laser beam LB emitted from an external laser light source 53 is incident on a deflection beam splitter surface 54a of a prism 54 provided on the fixed base 55. The laser beam LB consists of laser beams LB1, LB2 having slightly different frequencies from each other. The respective laser beams LB1 and LB2 form the S and P deflections with respect to the deflection beam splitter surface 54a. The laser beam LB1 is reflected by the deflection beam splitter surface 54a and a deflection beam splitter surface 54b and is incident on a photoelectric detector 58 via an analyzer 57.

On the other hand, the laser beam LB2 transmitted through the deflection beam splitter surface 54a is reflected by reflecting surfaces 56a and 56b of a prism 56 disposed on the fixed base 55, and transmitted through a deflection beam splitter surface 54b of the prism 54 to be incident on the photoelectric detector 58 via the analyzer 57. A beat signal obtained by photoelectrically converting the coherent light of the laser beams LB1, LB2 is supplied to a signal processing unit 50, which then calculates the refractive index of the gases in the light path of the laser beam LB2 from the change in frequency of the beat signal. The other refractive index measuring unit 51 has the same structure. That is, the refractive index of the gases is measured by monitoring the difference of the optical path lengths of the laser beams LB1, LB2 according to the heterodyne interference method.

According to this embodiment, the refractive index of the gases supplied to the environmental chamber 42 is changed such that the change in atmospheric pressure is canceled, so that changes in aberrations of the projected image in the projection exposure apparatus 44 can be limited to almost zero. Concerning this, as disclosed in Japanese Patent Application laid-Open No. 61-79228, there is a known system in which in order to change the refractive index of the air in a specific pressure room between two lens among a plurality of lenses, the mixture ratio of gas components of the air in the specific pressure room is changed. However, in this case, a sufficient diffusing system and a monitoring mechanism are required to mix the gas components of the air, which leads to the rise of cost. Also, all the aberrations of the projected image cannot be controlled to required levels only by changing the pressure in the specific pressure room to change the refractive index of a portion of the air in the projection optical system. On the other hand, in the system of this embodiment, the gas mixing system is introduced into a conventional mechanism for air-conditioning, so that the diffusing mechanism for air temperature control can be made to serve a double purpose. Therefore, it is possible to prohibit aberrations of the projected image without providing a new complex mechanism.

Further, this gas mixing system may be used together with a conventional air pressure control mechanism in the projection optical system and a conventional correcting mechanism for correcting the telecentric characteristic of the projection optical system. For example, the gas mixing system for adjusting the refractive index of the gases in the environmental chamber 42 described in this embodiment is used to correct changes in imaging characteristics due to the change in atmospheric pressure while the pressure in the specific pressure room in the projection optical system is changed (disclosed in U.S. Pat. No. 4,666,273) or a few lens elements in the projection optical system are driven (disclosed in U.S. Pat. No. 5,117,255) to correct changes in imaging characteristics due to the temperature rise in lenses caused by the illumination of exposure light, the switching of the illumination method in the illumination optical system (e.g., switching to a deformation light source method disclosed in Japanese Patent Application Laid-Open No. 4-225514. (U.S. Ser. No. 791,138, Nov. 13, 1991), i.e., the change in intensity distribution of light in the Fourier transform plane of the projection optical system with respect to the reticle pattern). Thus, by using the gas mixing system of this embodiment together with the conventional air pressure control mechanism or the like, changes in almost all aberrations can be prevented. Further, although two types of gases are mixed to keep the refractive index of the air constant thereby to control imaging characteristics in this embodiment, the refractive index of the air can be kept constant in spite of the change in atmospheric pressure by providing moistening and dehumidifying functions to the air-conditioning mechanism and thereby changing the humidity of the air or but changing the temperature of the air by means of the air-conditioning mechanism to such a degree that the system will not be adversely affected. An example of specific numerical values is shown below.

Under the temperature t [°C.], the pressure P [mmHg] and the humidity R [%], the refractive index n is obtained by:

$$n = \left\{ 0.38639 \times \frac{P(1 + 0.817 - 0.0133t) \times 10^{-6}P}{1 + 0.003661t} - 0.05608f \right\} \times 10^{-6}$$

$$f = \frac{R}{100} \times$$

$$P\{0.027688922 + 0.00167356(t - 23) + 0.00004413148 \, (t - 23)^2\}$$

(f: water vapour pressure)

Although this equation is derived from Edlen's formula, the change in refractive index n when the atmospheric pressure is varied from 720 to 770 [mmHg] is shown in the following table. (t=23° C., R=40%)

| Pressure P [mmHg] | Refractive Index n |
| --- | --- |
| 720 | 1.0002544 |
| 730 | 1.0002579 |
| 740 | 1.0002615 |
| 750 | 1.0002652 |
| 760 | 1.0002686 |
| 770 | 1.0002721 |

On the other hand, the change in refractive index n when the humidity is varied from 20 to 80% is shown in the following table.

| Humidity R [%] | Refractive Index n |
| --- | --- |
| 20 | 1.0002688 |
| 40 | 1.0002686 |
| 80 | 1.0002681 |

Thus, the refractive index can be adjusted slightly by changing the humidity, though it cannot correspond to the large change in atmospheric pressure. Next, refractive indexes of a plurality of gases under an above condition (t=23° C., R=40%, P=760 mmHg) are shown.

| Gas | Refractive Index n |
| --- | --- |
| Air | 1.0002686 |
| Oxygen | 1.0002486 |
| Nitrogen | 1.0002736 |
| Carbon Dioxide | 1.0004266 |
| Helium | 1.0000116 |

Here, it is considered that air is mixed with carbon dioxide and helium gas, which have very different refractive indexes. When the atmospheric pressure is varied from 720 to 770 [mmHg], the mixture ratio of the carbon dioxide and helium gas for canceling the change in refractive index due to the change atmospheric pressure is shown below.

| Pressure[mmHg] | Air Mixture Ratios [%] | | | Refractive Index |
|---|---|---|---|---|
| | Air | Carbon Dioxide | Helium | |
| 720 | 91.051 | 8.949 | 0.0 | 1.0002686 |
| 730 | 93.288 | 6.712 | 0.0 | 1.0002686 |
| 740 | 95.525 | 4.475 | 0.0 | 1.0002686 |
| 750 | 97.763 | 2.237 | 0.0 | 1.0002686 |
| 760 | 100.000 | 0.0 | 0.0 | 1.0002686 |
| 770 | 98.624 | 0.0 | 1.376 | 1.0002686 |

(the carbon dioxide contained in the air is excluded from the mixture ratio)

As above, when the mixture ratios of the gases in the chamber are changed to cancel the change in refractive index due to the change in atmospheric pressure, the apparent refractive index does not change, so that aberrations in the projection optical system will not be deteriorated due to the change in atmospheric pressure.

Although carbon dioxide and helium gases are used here, if lenses are designed not in accordance with the refractive index of air but in accordance with the gases assumed to contain 2% helium, the same effect can be obtained by mixing carbon dioxide into air. In this case, with respect to the mixture ratio of ordinary air of nitrogen:oxygen=8:2, the mixture ratios of gases are nitrogen:oxygen:carbon dioxide ≅7.2:1.8:1.0 and the ratio of oxygen is not so different, so there is no danger. However, since Edlen's formula pertains to ordinary air, slight correction is necessary when changing the mixture ratio of air.

According to the above embodiment, even though the pressure of the gases in the environmental chamber is changed, the refractive index of the gases is kept constant. Therefore, imaging characteristics of the projected image will not be deteriorated.

Also, when refractive index monitoring means is provided and the condition of a predetermined gas is changed by refractive index control means in accordance with the measurement results of the refractive index monitoring means and pressure monitoring means, the change in refractive index of the gas can be reduced by the feedback control.

Also, when the refractive index control means controls the refractive index of the predetermined gas by changing mixture ratios of a plurality of gases of different types, characteristics of temperature and humidity are kept constant.

It will be understood that the present invention is not limited to the above-described embodiment and various structures can be adopted without departing from the spirit of the present invention.

What is claimed is:

1. A projection exposure apparatus having an exposure processing section for forming a pattern on a substrate via a projection optical system, and a chamber for covering said exposure processing section, comprising:

at least one refractive index measuring unit that measures the actual refractive index of gas in said chamber and that generates a signal varied in accordance with the refractive index; and a refractive index control device that controls the refractive index of gas supplied to said chamber in response to at least one signal generated by said at least one refractive index measuring unit.

2. An apparatus according to claim 1, further comprising an atmospheric pressure sensor that measures atmospheric pressure in said chamber.

3. An apparatus according to claim 1, further comprising an atmospheric pressure sensor that measures atmospheric pressure in said chamber, wherein said refractive index control device controls the refractive index of the gas supplied to said chamber in accordance with a measurement result of said atmospheric pressure sensor and said at least one signal.

4. An apparatus according to claim 1, wherein the gas supplied to said chamber is supplied by an air-conditioning mechanism that supplies a temperature-controlled gas to said chamber.

5. An apparatus according to claim 4, wherein said refractive index control device controls the refractive index of the gas supplied to said chamber from said air-conditioning mechanism.

6. An apparatus according to claim 4, wherein said air-conditioning mechanism has a first supply source that emits air and a second supply source that emits a gas different from the air to supply a gas formed by the air and the gas different from the air to said chamber, and said refractive index control device adjusts the mixture ratio of said air to said gas different from the air.

7. An apparatus according to claim 1, wherein said refractive index control device is a mixture ratio control device that adjusts the mixture ratio of a plurality of gases of different types to control the refractive index of the gas supplied to said chamber.

8. An apparatus according to claim 7, wherein the gas supplied to said chamber is supplied by an air-conditioning mechanism, and wherein said air-conditioning mechanism diffuses the plurality of gases of different types.

9. An apparatus according to claim 1, wherein the gas supplied to said chamber is supplied by an air-conditioning mechanism, and wherein said refractive index control device controls said air-conditioning mechanism such that at least one of the temperature and humidity of the supplied gas is controlled.

10. A projection exposure apparatus having an exposure processing section constituted of a light source for emitting light, an illumination optical system for illuminating a mask with the light and a projection optical system for projecting and exposing an image of a pattern of said mask on a photosensitive substrate, an imaging characteristic adjusting section for adjusting imaging characteristics of said projection optical system, a chamber for covering said exposure processing section and an air-conditioning mechanism for supplying a temperature-controlled gas to said chamber, said projection exposure apparatus comprising:

at least one refractive index measuring unit that measures a change in the actual refractive index of the gas in said chamber and that generates a signal varied in accordance with the chance in refractive index;

a refractive index control device that controls the refractive index of the gas supplied from said air-conditioning mechanism to said chamber in response to at least one signal generated by said at least one refractive index measuring unit; and a control section that controls said imaging characteristics adjusting section, using the gas whose refractive index is controlled, so as to correct a change of the imaging characteristics of said projection optical system due to factors other than the change in refractive index of the gas in said chamber.

11. An apparatus according to claim 10, wherein said factors are a change in temperature of said projection optical system due to the emission of said light and a change in intensity distribution of said light in a Fourier transform plane of said projection optical system with respect to said pattern.

12. A projection exposure apparatus having an exposure processing section for forming an image of a pattern of a mask on a photosensitive substrate via a projection optical system and a chamber for covering said exposure processing section, comprising:

a device that corrects a change of imaging characteristics of said projection optical system due to a change in refractive index of a gas in said chamber by measuring the actual refractive index of the gas in said chamber, generating a signal that varies in accordance with the refractive index, and changing the refractive index of the gas in response to said signal; and a device that corrects a change of imaging characteristics of said projection optical system due to factors other than the change in refractive index.

13. A method of controlling optical performance in a projection exposure apparatus having an exposure processing section for forming a pattern on a substrate via a projection optical system, and a chamber for covering said exposure processing section, the method comprising the steps of:

measuring the actual refractive index of gas in said chamber and generating a signal that varies in accordance with the refractive index; and controlling the refractive index of gas supplied to said chamber in responses to the signal.

14. A method according to claim 13, further comprising the step of measuring atmospheric pressure in said chamber.

15. A method according to claim 13, wherein said step of measuring the actual refractive index of the gas includes measuring the actual refractive index of a sample of the gas in said chamber.

16. A method according to claim 13, wherein said step of controlling the refractive index of the gas includes supplying a gas formed by air and a gas different from the air to said chamber, and adjusting the mixture ratio of said air to said gas different from the air.

17. A method according to claim 13, wherein said step of controlling the refractive index of the gas includes adjusting the mixture ratio of a plurality of gases of different types.

18. A method according to claim 17, wherein the gas supplied to said chamber is supplied by an air-conditioning mechanism, said method further comprising the step of diffusing the plurality of gases of different types with said air-conditioning mechanism.

19. A method according to claim 13, wherein the gas supplied to said chamber is supplied by an air-conditioning mechanism, said method further comprising the step of controlling said air-conditioning mechanism such that at least one of the temperature and humidity of the supplied gas is controlled.

20. A method of controlling optical performance in a projection exposure apparatus having an exposure processing section constituted of a light source for emitting light, an illumination optical system for illuminating a mask with the light and a projection optical system for projecting and exposing a pattern on a substrate, and a chamber for covering said exposure processing section, the method comprising the steps of:

measuring a change in the actual refractive index of gas in said chamber and generating a signal that varies in accordance with the change in the refractive index;

controlling the refractive index of gas supplied to said chamber in response to the signal; and correcting a change of imaging characteristics of said projection optical system due to factors other than the change in refractive index.

21. A method according to claim 20, wherein said factors are a change in temperature of said projection optical system due to the emission of said light and a change in intensity distribution of said light in a Fourier transform plane of said projection optical system with respect to said pattern.

22. A method of controlling optical performance in a projection exposure apparatus having an exposure processing section for forming a pattern on a substrate via a projection optical system and a chamber for covering said exposure processing section, the method comprising the steps of:

correcting a change of imaging characteristics of said projection optical system due to a change in refractive index of a gas in said chamber by measuring the actual refractive index of the gas in said chamber, generating a signal that varies in accordance with the refractive index, and changing the refractive index of the gas in response to said signal; and correcting a change of imaging characteristics of said projection optical system due to factors other than the change in refractive index.

23. A projection exposure apparatus having an exposure processing section, said apparatus comprising:

a chamber that covers said exposure processing section;

a sensor that is disposed in said chamber and that measures a characteristic of gas in said chamber; and a refractive index control device that is connected to said chamber and that controls the refractive index of gas supplied to said chamber in accordance with a measurement result of said sensor.

24. An apparatus according to claim 23, wherein said sensor is an atmospheric pressure sensor that measures atmospheric pressure in said chamber.

25. An apparatus according to claim 23, wherein said sensor is a refractive index monitor that measures the actual refractive index of the gas in said chamber.

26. An apparatus according to claim 23, wherein said sensor is constituted of a refractive index monitor that measures the actual refractive index of the gas in said chamber, said apparatus further comprises an atmospheric pressure sensor that measures atmospheric pressure in said chamber, and said refractive index control device controls the refractive index of the supplied gas in accordance with measurement results of said atmospheric pressure sensor and said refractive index monitor.

27. An apparatus according to claim 23, further comprising an air-conditioning mechanism, wherein said air-conditioning mechanism has a first supply source for emitting air and a second supply source for emitting a gas different from the air to supply a gas formed by the air and the gas different from the air to said chamber, and said refractive index control device adjusts the mixture ratio of said air to said gas different from the air.

28. An apparatus according to claim 23, wherein said refractive index control device is a mixture ratio control device that adjusts the mixture ratio of a plurality of gases of different types to control the refractive index of the supplied gas.

29. An apparatus according to claim 28, wherein the gas supplied to said chamber is supplied by an air-conditioning mechanism.

30. An apparatus according to claim 29, wherein said air-conditioning mechanism diffuses the plurality of gases of different types.

31. An apparatus according to claim 23, wherein the gas supplied to said chamber is supplied by an air-conditioning mechanism, and wherein said refractive index control device controls said air-conditioning mechanism such that the temperature of the supplied gas is controlled.

32. A projection exposure apparatus having an exposure processing section that includes a projection optical system for projecting and exposing an image of a pattern of a mask on a photosensitive substrate, said projection exposure apparatus comprising:

a chamber that covers said exposure processing section;

an imaging characteristic adjusting section that is connected to said projection optical system and that adjusts an imaging characteristic of said projection optical system;

a sensor that is disposed in said chamber and that measures a change in a characteristic of gas in said chamber;

a refractive index control device that is connected to said chamber and that controls the refractive index of gas supplied to said chamber in accordance with a measurement result of said sensor; and a control section that is connected to said imaging characteristic adjusting section and that controls so as to correct a change of the imaging characteristic of said projection optical system due to factors other than a change in refractive index of the gas in said chamber.

33. An apparatus according to claim 32, wherein said factors are a change in temperature of said projection optical system and a change in light intensity distribution in a Fourier transform plane of said projection optical system with respect to said pattern.

34. A projection exposure apparatus having an exposure processing section for forming a pattern on a substrate via a projection optical system and a chamber for covering said exposure processing section, comprising:

a device that corrects a change of imaging characteristics of said projection optical system due to a change in refractive index of a gas in said chamber by measuring a characteristic of the gas in said chamber that indicates the refractive index of the gas in said chamber and controlling the refractive index of the gas; and a device that corrects a change of imaging characteristics of said projection optical system due to factors other than the change in refractive index.

35. A method of controlling optical performance in a projection exposure apparatus having an exposure processing section for forming an mage of a pattern of a mask on a photosensitive substrate via a projection optical system, a chamber for covering said exposure processing section, and an air-conditioning mechanism for supplying a temperature-controlled gas to said chamber, whereby said projection exposure apparatus performs exposure to said photosensitive substrate in a temperature-controlled atmosphere, the method comprising the steps of:

measuring a characteristic of the gas in said chamber that indicates the refractive index of the gas in said chamber; and controlling the refractive index of the gas supplied to said chamber from said air-conditioning mechanism in accordance with the measured characteristic of the gas by changing the humidity of the gas supplied to said chamber.

36. A method according to claim 35, wherein said step of measuring the characteristic of the gas includes measuring atmospheric pressure in said chamber.

37. A method according to claim 35, wherein said step of measuring the characteristic of the gas includes measuring the actual refractive index of a sample of the gas in said chamber.

38. A method according to claim 35, wherein said step of measuring the characteristic of the gas includes measuring the actual refractive index of a sample of the gas in said chamber and measuring atmospheric pressure in said chamber.

39. A method according to claim 35, wherein said step of controlling the refractive index of the gas includes supplying a gas formed by air and a gas different from the air to said chamber, and adjusting the mixture ratio of said air to said gas different from the air.

40. A method according to claim 35, wherein said step of controlling the refractive index of the gas includes adjusting the mixture ratio of a plurality of gases of different types.

41. A method according to claim 40, further comprising the step of diffusing the plurality of gases of different types with said air-conditioning mechanism.

42. A method according to claim 35, further comprising the step of controlling said air-conditioning mechanism such that the temperature of said gas is controlled.

43. A method of controlling optical performance in a projection exposure apparatus having an exposure processing section constituted of a light source for emitting light, an illumination optical system for illuminating a mask with the light and a projection optical system for projecting and exposing an image of a pattern of said mask on a photosensitive substrate, a chamber for covering said exposure processing section and an air-conditioning mechanism for supplying a temperature-controlled gas to said chamber, the method comprising the steps of:

measuring a change in a characteristic of the gas in said chamber that indicates the refractive index of the gas in said chamber;

controlling the refractive index of the gas supplied from said air-conditioning mechanism to said chamber in accordance with the measured change in the characteristic by changing the humidity of the gas supplied to said chamber; and correcting a change of imaging characteristics of said projection optical system due to factors other than a change in refractive index.

44. A method according to claim 43, wherein said factors are a change in temperature of said projection optical system due to the emission of said light and a change in intensity distribution of said light in a Fourier transform plane of said projection optical system with respect to said pattern.

45. A method of controlling optical performance in a projection exposure apparatus having an exposure processing section for forming an image of a pattern of a mask on a photosensitive substrate via a projection optical system and a chamber for covering said exposure processing section, the method comprising the steps of:

correcting a change of imaging characteristics of said projection optical system due to a change in refractive index of a gas in said chamber by measuring a characteristic of the gas in said chamber that indicates the refractive index of the gas in said chamber and controlling the refractive index of the gas by changing the humidity of the gas; and correcting a change of imaging characteristics of said projection optical system due to factors other than the change in refractive index.

46. A projection exposure apparatus having an exposure processing section, said projection exposure apparatus performing exposure to a substrate, comprising:

a chamber that covers said exposure processing section;

a sensor that is disposed in said chamber and that measures a characteristic of gas in said chamber; and a refractive index control device connected to said chamber that controls the refractive index of gas supplied to said chamber.

47. An apparatus according to claim 46, wherein said sensor is an atmospheric pressure sensor that measures atmospheric pressure in said chamber.

48. An apparatus according to claim 46, wherein said sensor is a refractive index monitor that measures the actual refractive index of the gas in said chamber.

49. An apparatus according to claim 46, wherein said sensor is constituted of a refractive index monitor that measures the actual refractive index of the gas in said chamber, said apparatus further comprises an atmospheric pressure sensor that measures atmospheric pressure in said chamber, and said refractive index control device controls the refractive index of the supplied gas in accordance with measurement results of said atmospheric pressure sensor and said refractive index monitor.

50. An apparatus according to claim 46, wherein the gas supplied to said chamber is supplied by an air-conditioning mechanism.

51. An apparatus according to claim 50, wherein said air-conditioning mechanism has a first supply source that emits air and a second supply source that emits a gas different from the air to supply a gas formed by the air and the gas different from the air to said chamber, and said refractive index control device adjusts the mixture ratio of said air to said gas different from the air.

52. An apparatus according to claim 50, wherein the refractive index control device controls the refractive index of the gas supplied to said chamber in accordance with a measurement result of said sensor by adjusting a mixture ratio of a plurality of gases of different types that collectively constitute the gas supplied to said chamber.

53. An apparatus according to claim 52, wherein said air-conditioning mechanism diffuses the plurality of gases of different types.

54. An apparatus according to claim 50, wherein said refractive index control device controls said air-conditioning mechanism such that at least one of the temperature and humidity of the supplied gas is controlled.

55. A projection exposure apparatus having an exposure processing section that includes a projection optical system, an imaging characteristic adjusting section, and a chamber for covering said exposure processing section, said projection exposure apparatus comprising:

a sensor that is disposed in said chamber and that measures a change in a characteristic of gas in said chamber;

a refractive index control device that is connected to said chamber and that controls the refractive index of gas supplied to said chamber; and a control section that controls said imaging characteristic adjusting section, so as to correct a change of an imaging characteristic of said projection optical system due to factors other than a change in refractive index of the supplied gas.

56. An apparatus according to claim 55, wherein said factors are a change in temperature of said projection optical system due to light illuminating a pattern projected by said projection optical system and a change in intensity distribution of said light in a Fourier transform plane of said projection optical system with respect to said pattern.

57. A projection exposure apparatus having an exposure processing section for forming an image of a pattern of a mask on a substrate via a projection optical system and a chamber for covering said exposure processing section, comprising:

a device that corrects a change of imaging characteristics of said projection optical system due to a change in refractive index of a gas in said chamber; and a device that corrects a change of imaging characteristics of said projection optical system due to factors other than the change in refractive index.

58. A method of controlling optical performance in a projection exposure apparatus having an exposure processing section for forming an image of a pattern of a mask on a photosensitive substrate via a projection optical system, a chamber for covering said exposure processing section, and an air-conditioning mechanism for supplying a temperature-controlled gas to said chamber, whereby said projection exposure apparatus performs exposure to said photosensitive substrate in a temperature-controlled atmosphere, the method comprising the steps of:

measuring a characteristic of the gas in said chamber that indicates the refractive index of the gas in said chamber; and controlling the refractive index of the gas supplied to said chamber from said air-conditioning mechanism in accordance with the measured characteristic of the gas by adjusting a mixture ratio of a plurality of gases of different types that collectively constitute the gas supplied to said chamber.

59. A method according to claim 58, wherein said step of measuring the characteristic of the gas includes measuring atmospheric pressure in said chamber.

60. A method according to claim 58, wherein said step of measuring the characteristic of the gas includes measuring the actual refractive index of a sample of the gas in said chamber.

61. A method according to claim 58, wherein said step of measuring the characteristic of the gas includes measuring the actual refractive index of a sample of the gas in said chamber and measuring atmospheric pressure in said chamber.

62. A method according to claim 58, wherein said step of controlling the :refractive index of the gas includes supplying a gas formed by air and a gas different from the air to said chamber, and adjusting the mixture ratio of said air to said gas different from the air.

63. A method according to claim 58, further comprising the step of diffusing the plurality of gases of different types with said air-conditioning mechanism.

64. A method according to claim 58, further comprising the step of controlling said air-conditioning mechanism such that at least one of the temperature and humidity of said gas is controlled.

65. A method of controlling optical performance in a projection exposure apparatus having an exposure processing section constituted of a light source for emitting light, an illumination optical system for illuminating a mask with the light and a projection optical system for projecting and exposing an image of a pattern of said mask on a photosensitive substrate, a chamber for covering said exposure processing section and an air-conditioning mechanism for supplying a temperature-controlled gas to said chamber, the method comprising the steps of:

measuring a change in a characteristic of the gas in said chamber that indicates the refractive index of the gas in said chamber;

controlling the refractive index of the gas supplied from said air-conditioning mechanism to said chamber in accordance with the measured change in the characteristic by adjusting a mixture ratio of a plurality of gases of different types that collectively constitute the gas supplied to said chamber; and correcting a change of imaging characteristics of said projection optical system due to factors other than the change in refractive index.

66. A method according to claim 65, wherein said factors are a change in temperature of said projection optical system due to the emission of said light and a change in intensity distribution of said light in a Fourier transform plane of said projection optical system with respect to said pattern.

67. A method of controlling optical performance in a projection exposure apparatus having an exposure processing section for forming an image of a pattern of a mask on a photosensitive substrate via a projection optical system and a chamber for covering said exposure processing section, the method comprising the steps of:

correcting a change of imaging characteristics of said projection optical system due to a change in refractive index of a gas in said chamber by measuring a characteristic of the gas in said chamber that indicates the refractive index of the gas in said chamber and changing the refractive index of the gas by adjusting a mixture ratio of a plurality of gases of different types that collectively constitute the gas in said chamber; and correcting a change of imaging characteristics of said projection optical system due to factors other than the change in refractive index.

68. An apparatus according to claim 1, wherein said at least one refractive index measuring unit optically measures the actual refractive index of said gas in said chamber.

69. An apparatus according to claim 1, wherein said at least one refractive index measuring unit measures the actual refractive index by measuring how the refractive index of the gas in said chamber affects light emitted from a light source.

70. A method according to claim 13, wherein said step of measuring the actual refractive index of the gas includes optically measuring the refractive index of the gas in said chamber.

71. A method according to claim 13, wherein the actual refractive index :is measured by measuring how the refractive index of the gas in said chamber affects light emitted from a light source.

72. An apparatus according to claim 23, wherein the refractive index is controlled by changing the humidity of the gas supplied to said chamber.

73. An apparatus according to claim 72, wherein the changing the humidity includes adding moisture to or removing moisture from the gas supplied to said chamber.

74. A method according to claim 35, wherein the changing the humidity includes adding moisture to the gas supplied to said chamber.

75. A method according to claim 35, wherein the changing the humidity includes removing moisture from the gas supplied to said chamber.

76. An apparatus according to claim 46, wherein said chamber is constructed to provide an output used to extract gas from said chamber, wherein the extracted gas is combined with a plurality of gases in order to produce the gas which is supplied to the chamber.

77. A method according to claim 58, wherein said chamber is constructed to provide an output used to extract gas from said chamber, wherein the extracted gas is combined with said plurality of gases in order to produce the gas which is supplied to the chamber.

78. A method for making a lithographic system, comprising:

providing a sensor that measures a characteristic of a gas in a chamber; and providing a refractive index control device that controls a refractive index of gas supplied to said chamber.

79. A method according to claim 78, wherein said sensor detects the refractive index of the gas in said chamber.

80. A method according to claim 78, wherein said sensor has an optical path passing through the gas in said chamber and detects an optical characteristic of said optical path.

81. A method according to claim 79, wherein said sensor has at least two optical paths and detects the refractive index of the gas in said chamber based on an interference information of said two optical paths.

82. A substrate which is produced by a lithographic system made by a method recited in claim 78.

83. An exposure apparatus, comprising:

a chamber which covers an exposure section;

an air-conditioning mechanism which controls an atmosphere in said chamber; and a refractive index measuring sensor that has an optical path passing through a gas in said chamber and that detects an optical characteristic of said optical path which corresponds to a refractive index of said gas.

84. An exposure apparatus according to claim 83, wherein said refractive index measuring sensor has at least two optical paths and detects the refractive index of said gas based on an interference information of said two optical paths.

85. An exposure apparatus according to claim 83, wherein said gas is a mixture of plural type gases, and said air-conditioning mechanism adjusts a supplying amount of at least one of said gases based on a measurement result of said refractive index measuring sensor.

* * * * *